United States Patent
Asada et al.

(10) Patent No.: US 8,207,790 B2
(45) Date of Patent: Jun. 26, 2012

(54) HIGH FREQUENCY POWER AMPLIFIER

(75) Inventors: Tomoyuki Asada, Tokyo (JP); Takao Haruna, Tokyo (JP); Jun Takaso, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/033,717

(22) Filed: Feb. 24, 2011

(65) Prior Publication Data

US 2011/0260794 A1  Oct. 27, 2011

(30) Foreign Application Priority Data

Apr. 26, 2010  (JP) .................. 2010-101027

(51) Int. Cl.
H03F 3/68  (2006.01)
H03F 3/191  (2006.01)
(52) U.S. Cl. ..................... 330/295; 330/302
(58) Field of Classification Search ............ 330/51, 330/124 R, 295, 302
See application file for complete search history.

(56) References Cited

U.S. PATENT DOCUMENTS

| 5,548,246 A | 8/1996 | Yamamoto et al. |
| 7,589,588 B2 | 9/2009 | Ohnishi et al. |
| 2011/0115565 A1* | 5/2011 | Cabanillas .................. 330/307 |

FOREIGN PATENT DOCUMENTS

| JP | 7-336168 A | 12/1995 |
| JP | 2003-318672 A | 11/2003 |
| JP | 2006-33731 A | 2/2006 |
| JP | 2006-333060 A | 12/2006 |

OTHER PUBLICATIONS

K. Kawakami et al.; "A Switch-Type Power Amplifier and Its Application to a CDMA Cellphone," *Proceedings of the 36th European Microwave Conference*, (2006), pp. 348-351.

* cited by examiner

*Primary Examiner* — Steven J Mottola
(74) *Attorney, Agent, or Firm* — Leydig, Voit & Mayer, Ltd (57) ABSTRACT

A high frequency power amplifier includes first and second transistors connected in parallel and amplifying a high frequency signal; a first switch connected to outputs of the first and second transistors and which connects an input terminal selectively to first and second output terminals; a third transistor amplifying a signal output from the first output terminal of the first switch; and a second switch having a first input terminal connected to the third transistor, a second input terminal connected to the second output terminal of the first switch, and which selectively connects the first and the second input terminals to an output terminal of the second switch.

8 Claims, 7 Drawing Sheets

HIGH FREQUENCY POWER AMPLIFIER

BACKGROUND OF THE INVENTION

1. Field of the Invention

The present invention relates to a high frequency power amplifier which makes it possible to improve the operating efficiency over a wide output power range.

2. Background Art

High frequency power amplifiers that amplify high frequency signals are used for cellular phones and portable terminals. Conventionally, a route in a high frequency power amplifier suitable for large power output operation is used to obtain large power output of 27.5 dBm and a route suitable for medium power output operation is used to obtain medium power output of 17 dBm, and operating efficiency at respective levels of output power is thereby improved (e.g., see Proceedings of the 36th European Microwave Conference, P 348-P 351).

SUMMARY OF THE INVENTION

Output power required for a high frequency power amplifier used for a CDMA cellular phone terminal ranges from −50 dBm to 27.5 dBm. However, conventional high frequency power amplifiers are not good enough to improve operating efficiency when output power is as small as 17 dBm or below.

In view of the above-described problems, an object of the present invention is to provide a high frequency power amplifier which makes it possible to improve the operating efficiency over a wide output power range.

According to the present invention, a high frequency power amplifier comprises: first and second transistors which are connected parallel to each other and amplify a high frequency signal inputted from outside; a first switch which includes a first input terminal connected to outputs of the first and second transistors, a first output terminal, and a second output terminal and connects the first input terminal to any one of the first output terminal and the second output terminal; a third transistor which amplifies a signal outputted from the first output terminal; and a second switch which includes a second input terminal connected to an output of the third transistor, a third input terminal connected to the second output terminal, and a third output terminal and connects any one of the second input terminal and the third input terminal to the third output terminal, wherein an output power of the first transistor is greater than an output power of the second transistor and an operating efficiency of the first transistor is lower than an operating efficiency of the second transistor.

The present invention makes it possible to improve the operating efficiency over a wide output power range.

Other and further objects, features and advantages of the invention will appear more fully from the following description.

DETAILED DESCRIPTION OF THE PREFERRED EMBODIMENTS

A high frequency power amplifier according to the embodiments of the present invention will be described with reference to the drawings. The same components will be denoted by the same symbols, and the repeated description thereof may be omitted.

First Embodiment

Figure 1:
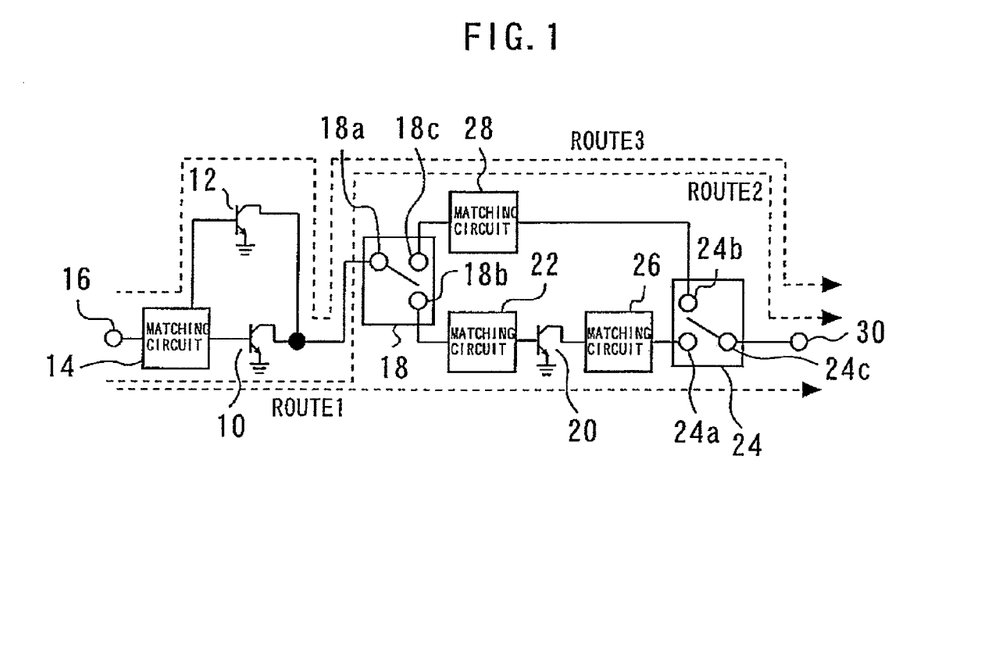
FIG. 1 is a circuit diagram illustrating a high frequency power amplifier according to a first embodiment.

FIG. 1 is a circuit diagram illustrating a high frequency power amplifier according to a first embodiment. Transistors 10 and 12 are connected parallel to each other and their inputs are connected to a signal input terminal 16 via an input matching circuit 14. The transistors 10 and 12 amplify a high frequency signal inputted from outside to the signal input terminal 16. The input matching circuit 14 matches input impedances of the transistors 10 and 12 to their respective characteristic impedances. The emitter size of the transistor 10 is greater than the emitter size of the transistor 12.

A switch 18 has an input terminal 18a connected to an output of the transistor 10 and an output of the transistor 12, an output terminal 18b and an output terminal 18c. The switch 18 connects the input terminal 18a to any one of the output terminal 18b and the output terminal 18c.

An input of a transistor 20 is connected to the output terminal 18b via an inter-stage matching circuit 22. The transistor 20 amplifies a signal outputted from the output terminal 18b. The inter-stage matching circuit 22 matches an output impedance of the transistor 10 with an input impedance of the transistor 20.

A switch 24 has an input terminal 24a connected to an output of the transistor 20 via an output matching circuit 26, an input terminal 24b connected to the output terminal 18c via an output matching circuit 28 and an output terminal 24c. The switch 24 connects any one of the input terminal 24a and the input terminal 24b to the output terminal 24c. The output terminal 24c is connected to a signal output terminal 30. The output matching circuit 26 matches an output impedance of the transistor 20 with a characteristic impedance. The output matching circuit 28 matches an output impedance of the transistor 10 and an output impedance of the transistor 12 with a characteristic impedance.

Next, operations of the above described high frequency power amplifier will be described. To obtain large power output of 17 dBm or more, the transistor 10 is turned ON, the transistor 12 is turned OFF and the transistor 20 is turned ON. The switch 18 connects the input terminal 18a to the output terminal 18b and the switch 24 connects the input terminal 24a to the output terminal 24c. In this way, a signal inputted to the signal input terminal 16 is amplified by the transistor 10 and the transistor 20 by passing through a route 1 and outputted from the signal output terminal 30.

To obtain medium power output of 7 to 17 dBm, the transistor 10 is turned ON, the transistor 12 is turned OFF and the transistor 20 is turned OFF. The switch 18 connects the input terminal 18a to the output terminal 18c and the switch 24 connects the input terminal 24b to the output terminal 24c. In this way, a signal inputted to the signal input terminal 16 is amplified by the transistor 10 by passing through a route 2 and outputted from the signal output terminal 30.

To obtain small power output of 7 dBm or less, the transistor 10 is turned OFF, the transistor 12 is turned ON and the transistor 20 is turned OFF. The switch 18 connects the input terminal 18a to the output terminal 18c and the switch 24 connects the input terminal 24b to the output terminal 24c. In this way, a signal inputted to the signal input terminal 16 is amplified by the transistor 12 by passing through a route 3 and outputted from the signal output terminal 30.

As described above, the emitter size of the transistor 10 is greater than the emitter size of the transistor 12. Therefore, the output power of the transistor 10 is greater than the output power of the transistor 12 and the operating efficiency of the transistor 10 is lower than the operating efficiency of the transistor 12. Here, the operating efficiency is expressed by (output power−input power)/power consumption×100(%). Power consumption is an operating voltage×operating current.

When obtaining small output power of 7 dBm or less, the present embodiment selects the transistor 12, and can thereby improve operating efficiency. Therefore, although the conventional high frequency power amplifier cannot improve operating efficiency when small output power of 7 dBm or less is used, the present embodiment can improve the operating efficiency. Thus, it is possible to improve the operating efficiency over a wide output power range.

Second Embodiment

Figure 2:
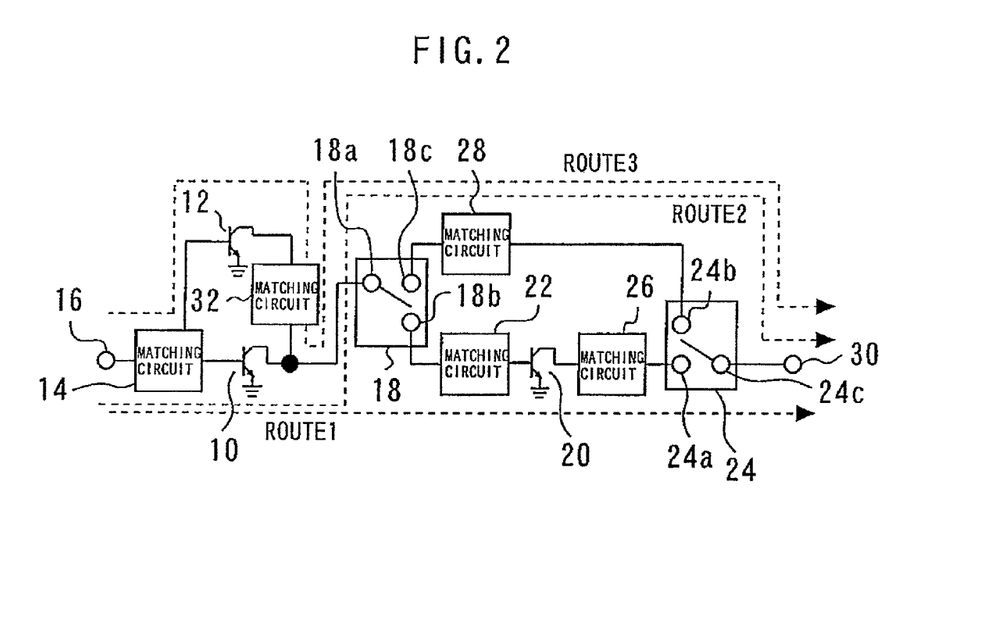
FIG. 2 is a circuit diagram illustrating a high frequency power amplifier according to a second embodiment.

FIG. 2 is a circuit diagram illustrating a high frequency power amplifier according to a second embodiment. In addition to the configuration of the first embodiment, a matching circuit 32 is connected between a connection point between the output of the transistor 10 and the input terminal 18a, and the output of the transistor 12. The matching circuit 32 matches an output impedance of the transistor 12 with an impedance of the route 3. The matching circuit 32 improves operating efficiency of the transistor 12.

Table 1 shows operating efficiency of the conventional high frequency power amplifier, the high frequency power amplifier according to the first embodiment and the high frequency power amplifier according to the second embodiment in the case of 7 dBm output. As is understandable from Table 1, the second embodiment can improve operating efficiency compared to the first embodiment.

TABLE 1

| | Operating efficiency in case of 7 dBm output |
|---|---|
| Conventional high frequency power amplifier | 6% |
| High frequency power amplifier according to first embodiment | 8% |
| High frequency power amplifier according to second embodiment | 12% |

Third Embodiment

Figure 3:
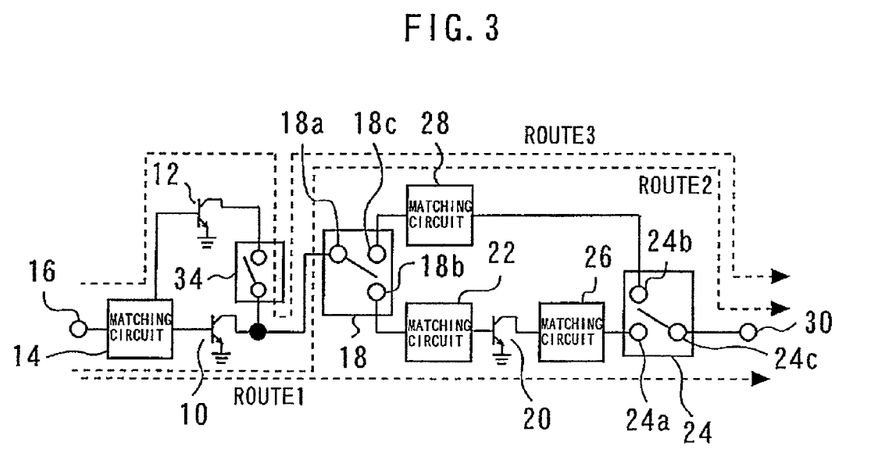
FIG. 3 is a circuit diagram illustrating a high frequency power amplifier according to a third embodiment.

FIG. 3 is a circuit diagram illustrating a high frequency power amplifier according to a third embodiment. In addition to the configuration of the first embodiment, a switch 34 is connected between a connection point between the output of the transistor 10 and the input terminal 18a, and the output of the transistor 12. When the transistor 10 operates and the transistor 12 does not operate, the switch 34 turns OFF (is left open). The switch 34 can reduce the amount of output power of the transistor 10 leaking to the collector of the transistor 12, and can thereby improve operating efficiency of the transistor 10.

Table 2 illustrates operating efficiency of the conventional high frequency power amplifier and the high frequency power amplifier according to the third embodiment in the case of 17 dBm output. As is understandable from Table 2, the third embodiment can improve operating efficiency by 3% compared to the conventional art.

TABLE 2

| | Operating efficiency in case of 17 dBm output |
|---|---|
| Conventional high frequency power amplifier | 24% |
| High frequency power amplifier according to third embodiment | 27% |

Fourth Embodiment

Figure 4:
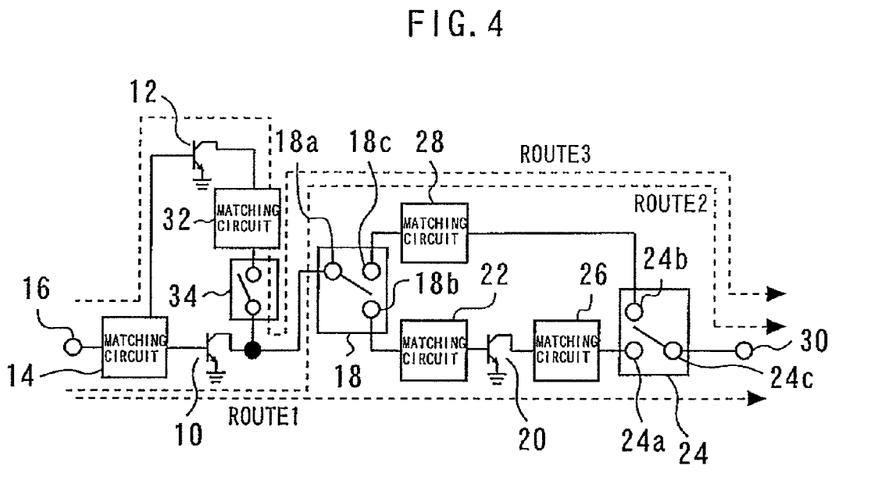
FIG. 4 is a circuit diagram illustrating a high frequency power amplifier according to a fourth embodiment.

FIG. 4 is a circuit diagram illustrating a high frequency power amplifier according to a fourth embodiment. In addition to the configuration of the first embodiment, the fourth embodiment is provided with both the matching circuit 32 of the second embodiment and the switch 34 of the third embodiment. It is thereby possible to obtain the effects of both the second embodiment and the third embodiment.

Figure 5:
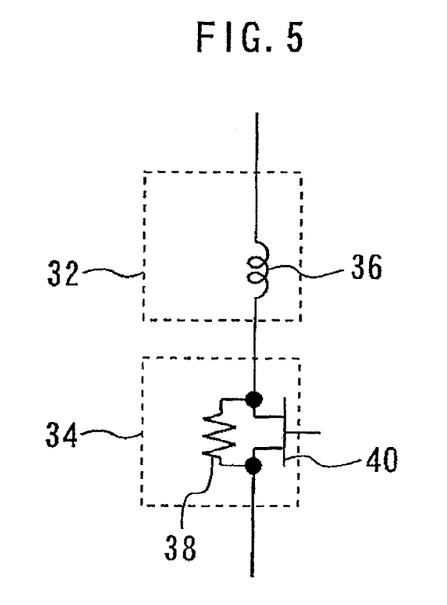
FIG. 5 is a circuit diagram illustrating the matching circuit 32 and the switch 34 according to the fourth embodiment.
Figure 6:
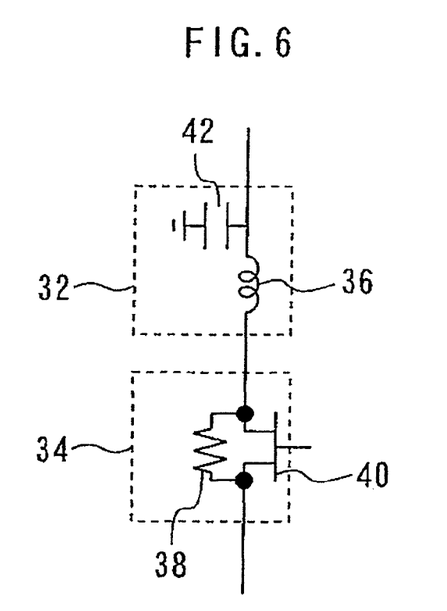
FIG. 6 is a circuit diagram illustrating a modification example of the matching circuit and the third switch according to the fourth embodiment.

FIG. 5 is a circuit diagram illustrating the matching circuit 32 and the switch 34 according to the fourth embodiment. The matching circuit 32 is an inductor 36. The switch 34 is a resistor 38 and a transistor 40 connected in parallel. FIG. 6 is a circuit diagram illustrating a modification example of the matching circuit 32 and the switch 34 according to the fourth embodiment. The matching circuit 32 is an inductor 36 and a capacitor 42. The connection positions of the matching circuit 32 and the switch 34 can be switched round.

Fifth Embodiment

Figure 7:
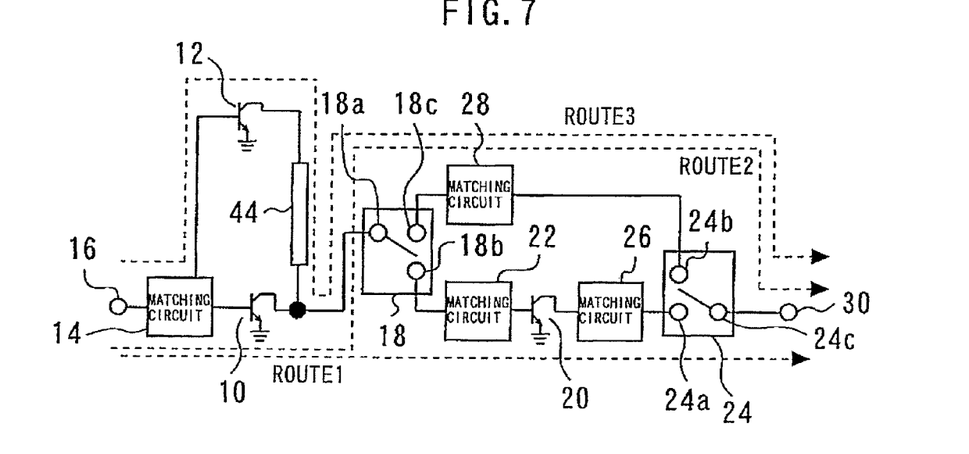
FIG. 7 is a circuit diagram illustrating a high frequency power amplifier according to a fifth embodiment.

FIG. 7 is a circuit diagram illustrating a high frequency power amplifier according to a fifth embodiment. In addition to the configuration of the first embodiment, a line 44 is connected between a connection point between the output of the transistor 10 and the input terminal 18a, and the output of the transistor 12. The line 44 has an electric length of ¼ of the wavelength of a high frequency signal. The line 44 can reduce the amount of output power of the transistor 10 leaking to the collector of the transistor 12, and can thereby improve operating efficiency of the transistor 10.

Sixth Embodiment

Figure 8:
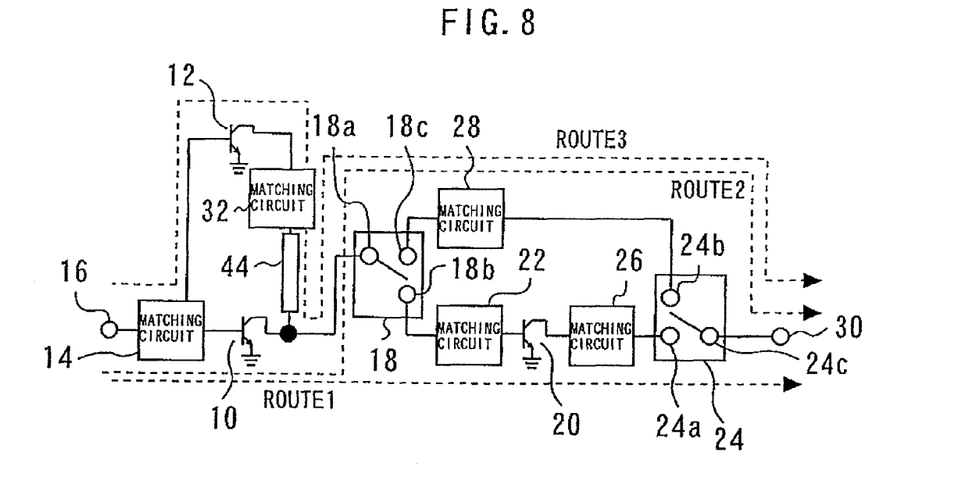
FIG. 8 is a circuit diagram illustrating a high frequency power amplifier according to a sixth embodiment.

FIG. 8 is a circuit diagram illustrating a high frequency power amplifier according to a sixth embodiment. In addition to the configuration of the first embodiment, both the matching circuit 32 of the second embodiment and the line 44 of the fifth embodiment are provided. This makes it possible to obtain the effects of both the second embodiment and the fifth embodiment.

Seventh Embodiment

Figure 9:
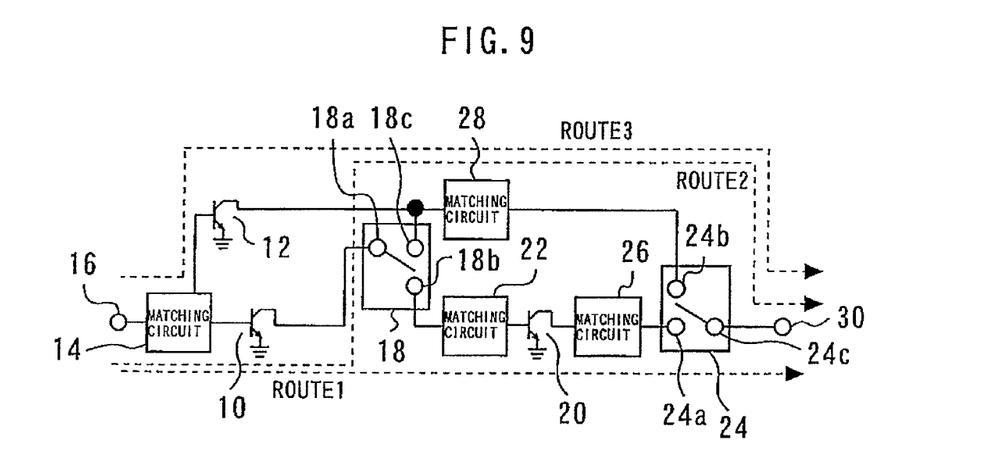
FIG. 9 is a circuit diagram illustrating a high frequency power amplifier according to a seventh embodiment.

FIG. 9 is a circuit diagram illustrating a high frequency power amplifier according to a seventh embodiment. Unlike the first embodiment, the output of the transistor 12 is connected to the output terminal 18c and is also connected to the input terminal 24b via the output matching circuit 28. This prevents the route 3 from being affected by loss at the switch 18. It is thereby possible to improve operating efficiency in the case of small power output of 7 dBm or less compared to the first embodiment.

Eighth Embodiment

Figure 10:
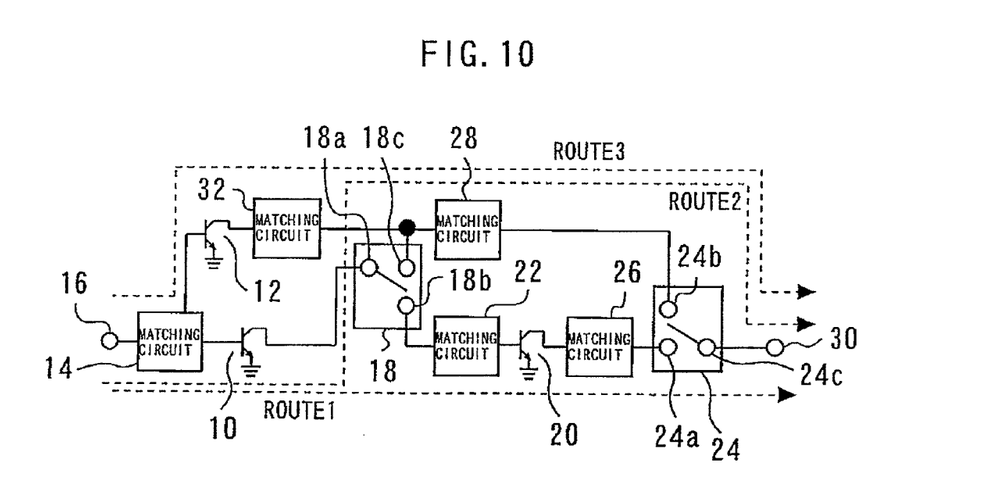
FIG. 10 is a circuit diagram illustrating a high frequency power amplifier according to an eighth embodiment.

FIG. 10 is a circuit diagram illustrating a high frequency power amplifier according to an eighth embodiment. In addition to the configuration of the seventh embodiment, the matching circuit 32 is connected between a connection point between the output terminal 18c and the output matching circuit 28 (input terminal 24b) and the output of the transistor 12. The matching circuit 32 matches an output impedance of the transistor 12 with an impedance of the route 3. The matching circuit 32 improves operating efficiency of the transistor 12.

Ninth Embodiment

Figure 11:
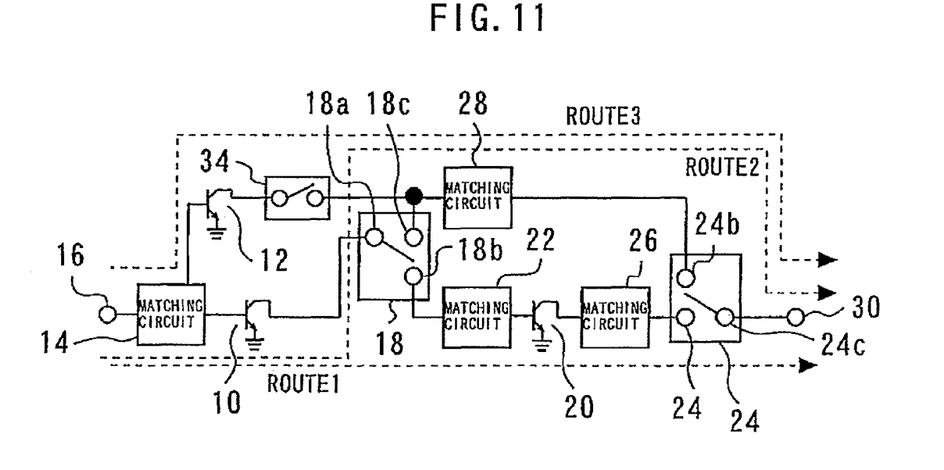
FIG. 11 is a circuit diagram illustrating a high frequency power amplifier according to a ninth embodiment.

FIG. 11 is a circuit diagram illustrating a high frequency power amplifier according to a ninth embodiment. In addition to the configuration of the seventh embodiment, the switch 34 is connected between a connection point between the output terminal 18c and the output matching circuit 28 (input terminal 24b) and the output of the transistor 12. When the transistor 10 operates and the transistor 12 does not operate, the switch 34 turns OFF (is left open). The switch 34 can reduce the amount of output power of the transistor 10 leaking to the collector of the transistor 12, and can thereby improve operating efficiency of the transistor 10.

Tenth Embodiment

Figure 12:
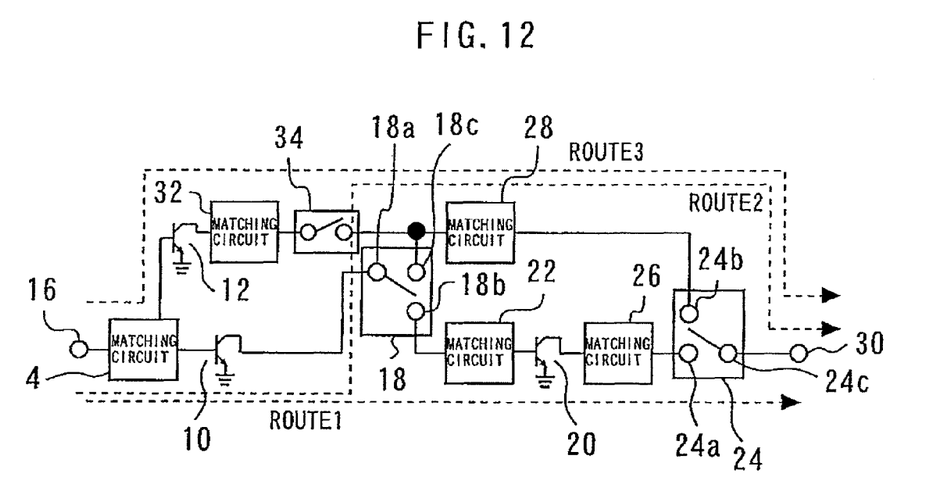
FIG. 12 is a circuit diagram illustrating a high frequency power amplifier according to a tenth embodiment.

FIG. 12 is a circuit diagram illustrating a high frequency power amplifier according to a tenth embodiment. In addition to the configuration of the seventh embodiment, both the matching circuit 32 of the eighth embodiment and the switch 34 of the ninth embodiment are provided. This makes it possible to obtain the effects of both the eighth embodiment and the ninth embodiment.

Eleventh Embodiment

Figure 13:
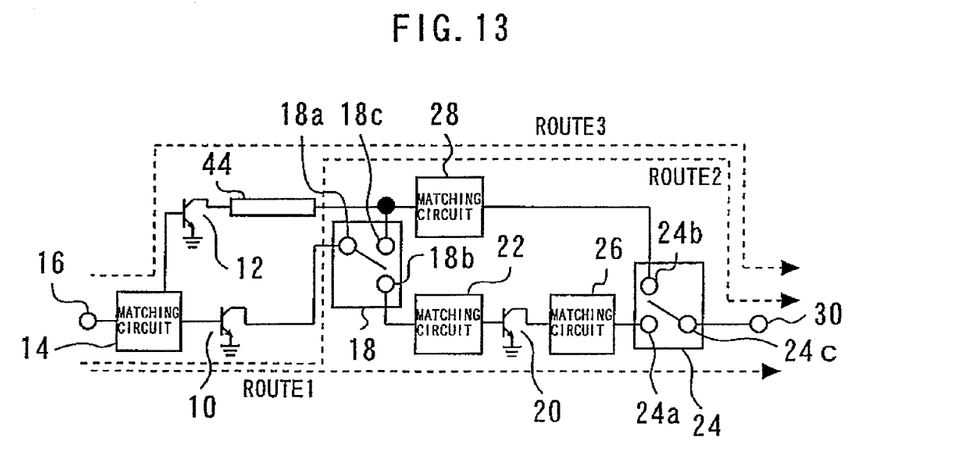
FIG. 13 is a circuit diagram illustrating a high frequency power amplifier according to an eleventh embodiment.

FIG. 13 is a circuit diagram illustrating a high frequency power amplifier according to an eleventh embodiment. In addition to the configuration of the seventh embodiment, the line 44 is connected between a connection point between the output terminal 18c and the output matching circuit 28 (input terminal 24b), and the output of the transistor 12. The line 44 has an electric length of ¼ of the wavelength of a high frequency signal. The line 44 can reduce the amount of output power of the transistor 10 leaking to the collector of the transistor 12, and can thereby improve operating efficiency of the transistor 10.

Twelfth Embodiment

Figure 14:
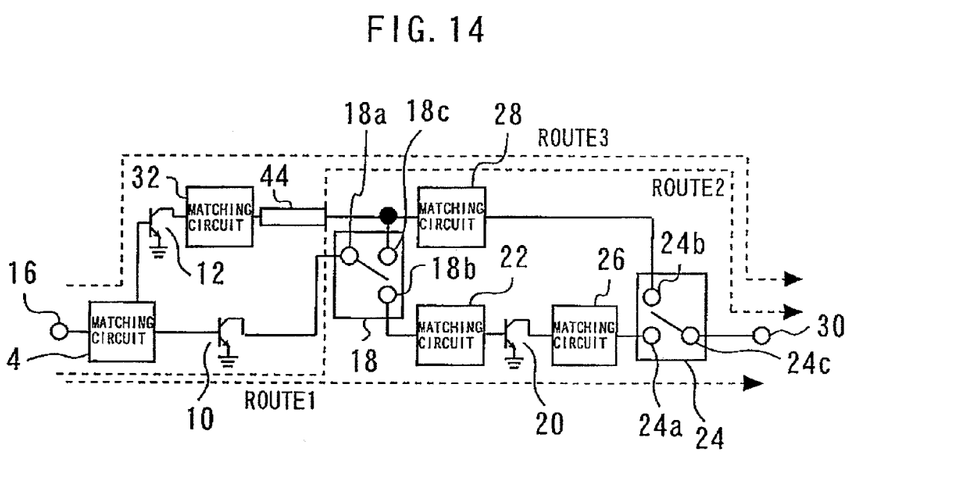
FIG. 14 is a circuit diagram illustrating a high frequency power amplifier according to a twelfth embodiment.

FIG. 14 is a circuit diagram illustrating a high frequency power amplifier according to a twelfth embodiment. In addition to the configuration of the seventh embodiment, both the matching circuit 32 of the eighth embodiment and the line 44 of the eleventh embodiment are provided. This makes it possible to obtain the effects of both the eighth embodiment and the eleventh embodiment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-101027, filed on Apr. 26, 2010 including specification, claims, drawings and summary, on which the Convention priority of the present application is based, are incorporated herein by reference in its entirety.

What is claimed is:

1. A high frequency power amplifier comprising:
first and second transistors which are connected in parallel to each other and which amplify a high frequency signal input from outside;
a first switch which includes an input terminal connected to outputs of the first and second transistors, a first output terminal, and a second output terminal, the first switch selectively connecting the input terminal of the first switch to the first output terminal of the first switch and the second output terminal of the first switch;
a third transistor which amplifies a signal output from the first output terminal of the first switch; and
a second switch which includes first input terminal connected to an output of the third transistor, a second input terminal connected to the second output terminal of the first switch, and an output terminal, the second switch selectively connecting the first input terminal of the second switch and the second input terminal of the second switch to the output terminal of the second switch, wherein
output power of the first transistor is larger than output power of the second transistor, and
operating efficiency of the first transistor is lower than operating efficiency of the second transistor.

2. The high frequency power amplifier according to claim 1, further comprising a matching circuit connected between a connection point between the output of the first transistor and the input terminal of the first switch, and the output of the second transistor.

3. The high frequency power amplifier according to claim 1, further comprising a third switch connected between a connection point between the output of the first transistor and the input terminal of the first switch, and the output of the second transistor, wherein the third switch turns OFF when the first transistor operates and the second transistor does not operate.

4. The high frequency power amplifier according to claim 1, further comprising a line connected between a connection point between the output of the first transistor and the input terminal of the first switch, and the output of the second transistor, wherein the line has an electrical length of ¼ wavelength of the high frequency signal.

5. A high frequency power amplifier comprising:
first and second transistors which are connected in parallel to each other and which amplify a high frequency signal input from outside;
a first switch which includes an input terminal connected to an output of the first transistor, a first output terminal, and a second output terminal, the first switch selectively connecting the input terminal of the first switch to the first output terminal of the first switch and the second output terminal of the first switch;
a third transistor which amplifies a signal output from the first output terminal of the first switch; and
a second switch which includes a first input terminal connected to an output of the third transistor, a second input terminal connected to an output of the second transistor and the second output terminal of the first switch, and an output terminal, the second switch selectively connecting the first input terminal of the second switch and the second input terminal of the second switch to the output terminal of the second switch, wherein output power of the first transistor is larger than output power of the second transistor, and
operating efficiency of the first transistor is lower than operating efficiency of the second transistor.

6. The high frequency power amplifier according to claim 5, further comprising a matching circuit connected between a connection point between the second output terminal of the first switch and the second input terminal of the second switch, and the output of the second transistor.

7. The high frequency power amplifier according to claim 5, further comprising a third switch connected between a connection point between the second output terminal of the first switch and the second input terminal of the second switch, and the output of the second transistor, wherein the third switch turns OFF when the first transistor operates and the second transistor does not operate.

8. The high frequency power amplifier according to claim 5, further comprising a line connected between a connection point between the second output terminal of the first switch and the second input terminal of the second switch, and the output of the second transistor, wherein the line has an electrical length of ¼ wavelength of the high frequency signal.

* * * * *